United States Patent [19]

Bulat et al.

[11] Patent Number: 5,126,805
[45] Date of Patent: Jun. 30, 1992

[54] JUNCTION FIELD EFFECT TRANSISTOR WITH SIGE CONTACT REGIONS

[75] Inventors: Emel S. Bulat, Framingham; Marvin J. Tabasky, Peabody, both of Mass.

[73] Assignee: GTE Laboratories Incorporated, Waltham, Mass.

[21] Appl. No.: 593,145

[22] Filed: Oct. 5, 1990

Related U.S. Application Data

[62] Division of Ser. No. 440,930, Nov. 14, 1989, Pat. No. 4,983,536.

[51] Int. Cl.$^5$ .................... H01L 29/80; H01L 29/163
[52] U.S. Cl. .................................... 357/22; 357/23.1; 357/16; 357/61; 357/67
[58] Field of Search ............ 357/67, 61, 22, 23.1, 357/16

[56] References Cited

U.S. PATENT DOCUMENTS

| | | | |
|---|---|---|---|
| 4,521,794 | 6/1985 | Murase et al. | 357/67 |
| 4,551,909 | 11/1985 | Cogan et al. | 29/571 |
| 4,596,605 | 6/1986 | Nishizowa et al. | 437/911 |
| 4,611,384 | 9/1986 | Bencuya et al. | 29/571 |
| 4,617,066 | 10/1986 | Vosudev | 437/24 |
| 4,835,112 | 5/1989 | Pfiester et al. | 437/24 |
| 4,837,173 | 6/1989 | Alvis et al. | 437/24 |
| 4,849,371 | 7/1989 | Hansen et al. | 437/131 |

FOREIGN PATENT DOCUMENTS

| | | | |
|---|---|---|---|
| 122384 | 10/1978 | Japan | 437/911 |
| 5562571 | 4/1982 | Japan | 357/16 |

OTHER PUBLICATIONS

Growth, nucleation & electrical properties of molecular beam epitaxially grown AS-doped GE on Si Substrates, P. Sheldon et al, J Vac. Sci. Tech. A, vol. 4, No. 3, May/Jun. 1986.

Tamama, T., Voltage-Controlled Negative Resistance In a Submicron Vertical JFET, Solid State Elec., Oct. 1984, pp. 855-866.

*Primary Examiner*—Jerome Jackson, Jr.
*Attorney, Agent, or Firm*—Victor F. Lohmann, III

[57] ABSTRACT

A junction field effect transistor, specifically a static induction transistor. Prior to metallization a thin layer of germanium is placed over the exposed silicon of the source and gate regions. The germanium is intermixed with the underlying silicon to form a germanium-silicon composite. A rapid thermal anneal is performed to recrystallize the germanium-silicon composite. Alternatively, a single crystal epitaxial layer may be deposited on the silicon. Conventional metallization procedures are employed to produce ohmic source and gate contact members to the germanium-silicon composite or the epitaxial germanium of the source and gate regions. By virtue of the reduced bandgap provided by the presence of the germanium, the contact resistance of the device is reduced.

1 Claim, 3 Drawing Sheets

JUNCTION FIELD EFFECT TRANSISTOR WITH SIGE CONTACT REGIONS

This is a divisional of copending application Ser. No. 440,930, filed Nov. 14, 1989, now U.S. Pat. No. 4,983,536.

BACKGROUND OF THE INVENTION

This invention relates to semiconductor devices. More particularly, it is concerned with junction field effect transistors of the static induction type and to methods of fabricating.

The static induction transistor is a field effect semiconductor device capable of operation at relatively high frequency and power. The transistors are characterized by a short, high resistivity semiconductor channel region which may be controllably depleted of carriers. The current-voltage characteristics of the static induction transistor are generally similar to those of a vacuum tube triode.

The static induction transistor generally uses vertical geometry with source and drain electrodes placed on opposite sides of a thin, high resistivity layer of silicon of one conductivity type. Gate regions of the opposite conductivity type are positioned in the high resistivity layer on opposite sides of the source. During operation a reverse bias is applied between the gate regions and the remainder of the high resistivity layer causing a depletion region to extend into the channel region below the source. As the magnitude of the reverse bias is varied, the source-drain current and voltage derived from an attached energy source will also vary.

Metallic members are formed in ohmic contact with the silicon at the source, gate, and drain regions of the device. These contact members may be fabricated by using any of various well-known conventional metallization techniques. Although current procedures of forming ohmic contacts provide high quality devices further reduction in contact resistance is desirable in order to provide improved device performance.

SUMMARY OF THE INVENTION

A method of fabricating a field effect transistor in accordance with the present invention comprises providing a body of silicon including a substrate of silicon of one conductivity type of relatively low resistivity and a layer of silicon of the one conductivity type of relatively high resistivity contiguous with the substrate. The layer has a surface at a surface of the body. A layer of adherent, nonconductive, protective material is formed adherent at the surface with openings therein exposing alternating source surface areas and gate surface areas. Conductivity type imparting material of the opposite conductivity type is introduced into the layer of silicon of the one conductivity type of relatively high resistivity from the gate surface areas to produce gate regions of the opposite conductivity type in the layer of silicon of the one conductivity type of relatively high resistivity at the gate surface areas. Conductivity type imparting material of the one conductivity type is introduced into the layer of silicon of the one conductivity type of relatively high resistivity from the source surface areas to produce source regions of the one conductivity type of lower resistivity in the layer of silicon of the one conductivity type of relatively high resistivity at the source surface areas. Germanium is placed at the source surface areas and the gate surface areas. A germanium-silicon composite of the germanium with underlying silicon is formed at the source surface areas and the gate surface areas. Conductive material is then applied to form source and gate contacts in ohmic contact with the germanium-silicon composite at the source and gate regions respectively.

A junction field effect transistor in accordance with the present invention comprises a body of silicon including a substrate of silicon of one conductivity type of relatively low resistivity and a layer of silicon of the one conductivity type of relatively high resistivity contiguous with the substrate. The layer of silicon has a surface at the surface of the body. A layer of adherent, nonconductive, protective material is adherent at the surface and has openings therein defining alternating source surface areas and gate surface areas. A source region of the one conductivity type of relatively low resistivity is inset in the layer of silicon of the one conductivity type of relatively high resistivity at each of the source surface areas. A gate region of the opposite conductivity type is inset in the layer of silicon of the one conductivity type of relatively high resistivity at each of the gate surface areas. A recrystallized zone of germanium-silicon composite is in each of the source regions and each of the gate regions at the source surface areas and gate surface areas, respectively. A source contact member is in ohmic contact with the germanium-silicon composite in each of the source regions at each of the source surface areas. A gate contact member is in ohmic contact with the germanium-silicon composite in each of the gate regions at each of the gate surface areas. A drain contact member is in ohmic contact with the silicon of the substrate.

In accordance with another aspect of the invention there is provided a body of silicon including a substrate of silicon of one conductivity type of relatively low resistivity and a layer of silicon of the one conductivity type of relatively high resistivity contiguous with the substrate. The layer has a surface at a surface of the body. A layer of adherent, nonconductive, protective material is formed adherent at the surface with openings therein exposing alternating source surface areas and gate surface areas. Conductivity type imparting material of the opposite conductivity type is introduced into the layer of silicon of the one conductivity type of relatively high resistivity from the gate surface areas to produce gate regions of the opposite conductivity type in the layer of silicon of the one conductivity type of relatively high resistivity at the gate surface areas. Conductivity type imparting material of the one conductivity type is introduced into the layer of silicon of the one conductivity type of relatively high resistivity from the source surface areas to produce source regions of the one conductivity type of lower resistivity in the layer of silicon of the one conductivity type of relatively high resistivity at the source surface areas. An epitaxial layer of germanium is grown on the surface of the silicon at the source surface areas and at the gate surface areas. Conductive material is applied to form source and gate contact members in ohmic contact with the germanium overlying the silicon of the source and gate regions, respectively.

A junction field effect transistor in accordance with another aspect of the invention comprises a body of silicon including a substrate of silicon of one conductivity type of relatively low resistivity and a layer of silicon of the one conductivity type of relatively high resistivity contiguous with the substrate. The layer of silicon has a surface at the surface of the body. A layer of adherent nonconductive, protective material is adherent at the surface and has openings therein defining alternating source surface areas and gate surface areas. A source region of the one conductivity type of relatively low resistivity is inset in the layer of silicon of the one conductivity type of relatively high resistivity at each of the source surface areas. A gate region of the opposite conductivity type is inset in the layer of silicon of the one conductivity type of relatively high resistivity at each of the gate surface areas. A layer of germanium is in epitaxial contact with silicon in each of the source regions and each of the gate regions at the source surface areas and gate surface areas, respectively. A source contact member is in ohmic contact with the germanium at each of the source surface areas, and a gate contact member is in ohmic contact with the germanium at each of the gate surface areas. A drain contact member is in ohmic contact with the silicon of the substrate.

For a better understanding of the present invention, together with other and further objects, advantages, and capabilities thereof, reference is made to the following discussion and appended claims in connection with the above-described drawings.

DETAILED DESCRIPTION

In fabricating junction field effect transistors of the static induction type in accordance with the present invention, a substrate of single crystal semiconductor material of one conductivity type is provided as a supporting structure. As is well understood the substrate is usually a slice or wafer of relatively large surface area. However, for purposes of illustration fabrication of only a portion of a single static induction transistor in a fragment of a slice is shown and described. In the following description silicon is employed as the semiconductor material and the substrate is of relatively low resistivity N-type conductivity.

Figure 1A:
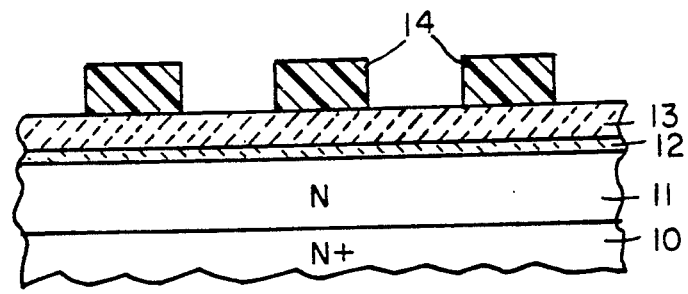
FIGS. 1A through 1F are a series of elevational views in cross-section of a fragment of a wafer of silicon illustrating successive steps in the fabrication of a junction field effect transistor of the static induction type up to the step of applying ohmic metal contacts thereto.

Various stages in the fabrication of a static induction transistor in accordance with the invention are illustrated by FIGS. 1A through 1F. A slice or wafer of N-type silicon of uniform, relatively low resistivity having flat, planar parallel opposed major surfaces, a fragment 10 of which is shown in FIG. 1A is produced by any of the known techniques of crystal fabrication including appropriate slicing and cleaning operations. An epitaxial layer 11 of N-type silicon of uniform relatively high resistivity is grown on the surface of the substrate 10 as by known vapor deposition techniques. The epitaxial layer 11 is precisely controlled as to thickness and as to resistivity and is a continuation of the crystalline structure of the single crystal substrate 10. The upper surface of the epitaxial layer 11 is parallel to the interface between the substrate and the layer.

Figure 1B:
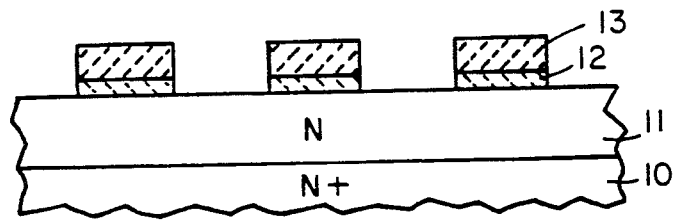

A thin layer of silicon oxide 12 is grown on the surface of the epitaxial layer 11 and a layer of silicon nitride 13 is deposited on the silicon oxide layer. The silicon nitride layer 13 is then covered with a layer of photoresist material 14. By employing known photolithographic techniques portions of the photoresist layer 14 are removed to expose the surface of the silicon nitride layer 13 in a pattern of elongated parallel areas which define the pattern of the source and gate regions of the device. The silicon nitride and silicon oxide layers 13 and 12 are etched employing known plasma etching techniques and then the remaining photoresist 14 is removed (FIG. 1B).

Figure 1C:
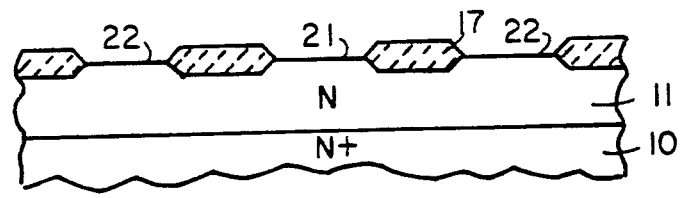

The wafer is then exposed to oxygen at an elevated temperature to grow a relatively thick silicon oxide layer 17 in the elongated areas between the elongated strips of silicon nitride 13, as illustrated in FIG. 1C. The remaining silicon oxide layer 12 and silicon nitride layer 13 are removed by treating in a suitable etching solution. The resulting wafer as illustrated in FIG. 1C includes protective layers of thick silicon oxide 17 between exposed surface areas. The surface areas are alternately source surface areas 21 and gate surface areas 22.

Figure 1D:
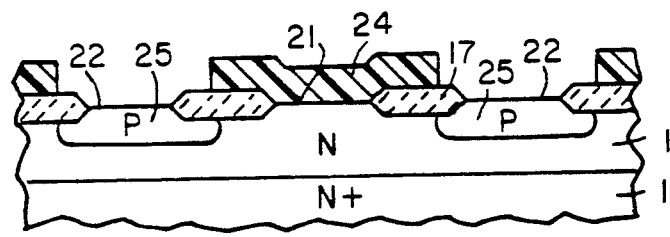

As illustrated in FIG. 1D the source surface areas 21 are protected with a layer of photoresist material 24 so that only the gate surface areas 22 remain exposed. P-type conductivity type imparting material, for example boron, is then introduced into the wafer at the exposed gate surface areas 22 by conventional ion implantation techniques. The protective photoresist material 24 is removed, and the wafer is heated to cause the implanted P-type conductivity imparting material to diffuse into the epitaxial layer 11 from the gate surface areas 22. As a result of the ion implantation and subsequent heating gate regions 25 of P-type conductivity are thus produced inset in the high resistivity N-type material of the epitaxial layer 11.

Figure 1E:
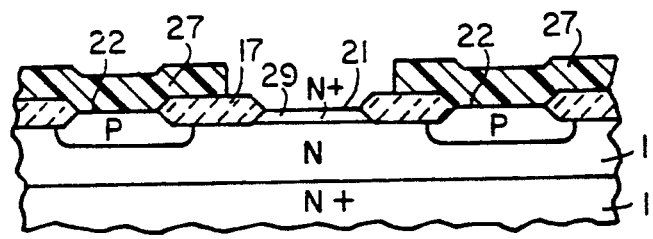
Figure 1F:
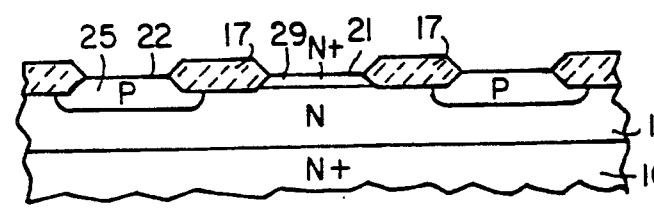

The photoresist material 24 is removed and the gate surface areas 22 are appropriately protected by photoresist material 27. (FIG. 1E.) A shallow, heavily doped N-type source region 29 is formed at each of the source surface areas 21 by ion implantation of arsenic as illustrated in FIG. 1E. The photoresist 27 is removed from the gate surface areas and the wafer is annealed in order to activate the implanted ions of the source regions 29. The resulting wafer at this stage is illustrated in FIG. 1F. The wafer includes a substrate 10, an epitaxial layer 11 having inset therein a plurality of P- type gate regions 25 and N-type source regions 29. The silicon surfaces between the source and gate regions are protected by the thick layers of grown silicon oxide 17. This structure is a conventional static induction transistor produced in accordance with standard processing procedures.

Figure 2A:
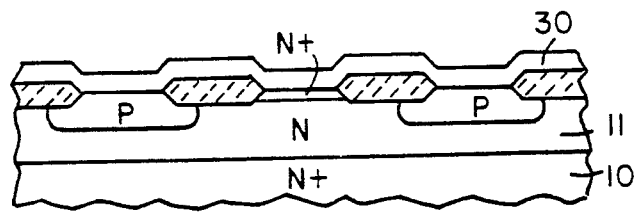
FIGS. 2A through 2D illustrate a first method of forming ohmic contacts to a static induction transistor in accordance with the present invention.
Figure 2B:
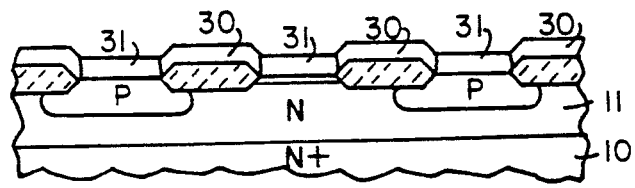

FIGS. 2A through 2D illustrate further processing of the wafer of FIG. 1F in accordance with one method of the present invention. The wafer as illustrated in FIG. 1F is treated by evaporating a thin layer of germanium 30 over the entire surface of the wafer as illustrated in FIG. 2A. The thickness of the germanium layer 30 is less than 500 angstroms and preferably between 200 and 300 angstroms. The wafer may then be treated by the implantation of argon ions in order to intermix the germanium with the underlying silicon thus forming a germanium-silicon composite 31. (FIG. 2B.) The wafer is heated in rapid thermal annealing apparatus to a temperature between 700° and 900° C. for less than two minutes in order to cause recrystallization of the germanium-silicon composite 31. At the same time, the composite is effectively doped N-type or P-type by the impurities in the underlying silicon. Desirably the recrystallized germanium-silicon composite is 10 to 20 atomic percent germanium.

Figure 2C:
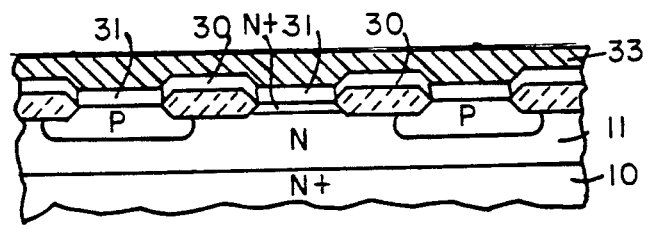
Figure 2D:
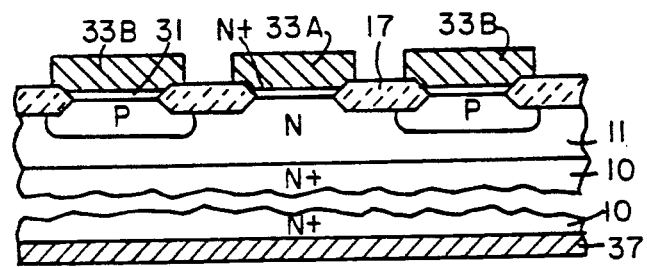

As illustrated in FIG. 2C the surface of the wafer is coated with a suitable metal layer 32. For example, titanium tungsten (TiW) is deposited over the surface of the wafer to a thickness of between 1.000 and 2.500 angstroms. This material serves as a barrier between the germanium-silicon composite 31 and an overlying layer of aluminum 9.000 angstroms thick which is deposited over the TiW. A thin layer of TiW approximately 300 angstroms thick may be deposited on the aluminum to serve as an antireflective coating. The layer 33 is then suitably masked and plasma etched to remove unwanted metallization and to leave metal contact members 33A and 33B in the pattern of desired ohmic contacts to the source and gate regions, respectively. (FIG. 2D.) The plasma etching process also removes any residual germanium 30 overlying the silicon oxide 17 which might otherwise electrically short out the source and gate regions. The contact members 33A and 33B are in ohmic contact with the germanium-silicon composite in the source and gate regions at the source and gate surface areas, respectively. The source contact members 33A are appropriately connected together and to a source bonding pad (not shown), and the gate contact members 33B are appropriately connected together and to a gate bonding pad (not shown) in a conventional manner. A metal layer 37 is applied to the bottom surface of the substrate 10 in order to provide a suitable drain contact member.

Figure 3A:
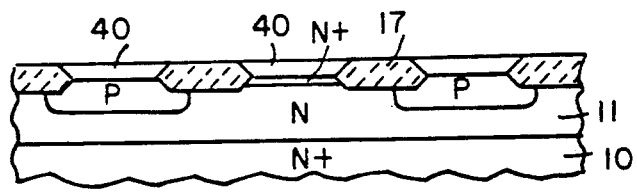
FIGS. 3A through 3C illustrate a second method in accordance with the present invention of forming ohmic contacts to a static induction transistor.
Figure 3B:
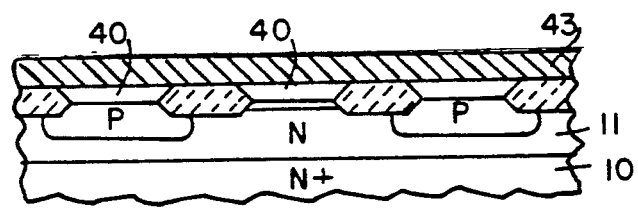
Figure 3C:
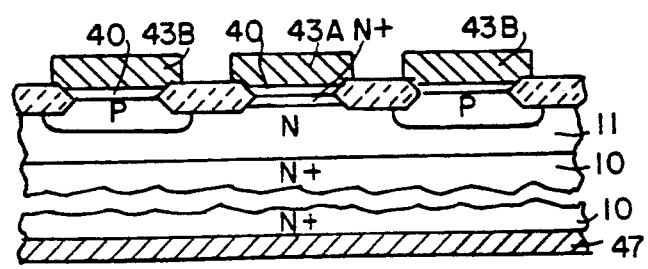

A second method of forming ohmic metal contacts to the source and gate regions of the device structure of FIG. 1F is illustrated by FIGS. 3A through 3C. As illustrated in FIG. 3A a thin layer of single crystal germanium 40 is epitaxially grown on the exposed silicon source and gate surface areas by employing well-known epitaxial deposition techniques. Germanium does not deposit on the intervening silicon oxide regions 17. The surface of the wafer is then covered with metallization 43. As in the method previously discussed, the metallization may be layers of TiW and aluminum with a nonreflective coating of TiW on the aluminum. Then using conventional masking and etching techniques as previously described the overlying metal 43 is selectively removed to provide the structure as illustrated in FIG. 3C. Contact members 43A and 43B are in ohmic contact with the epitaxial germanium 40 overlying the source and gate regions, respectively. The bottom surface of the substrate is also metallized to provide an ohmic drain contact member 47.

As an alternative, after the epitaxial deposition of the germanium layer 40 (FIG. 3A). the wafer may be subjected to ion implantation of argon. This procedure intermixes the germanium with the underlying silicon to form a germanium-silicon composite. The wafer is then subjected to a rapid thermal annealing treatment to recrystallize the germanium-silicon composite. Metallization to form ohmic metal contact members to the germanium-silicon composite material of the source and gate regions is accomplished in the manner described above.

Figure 4A:
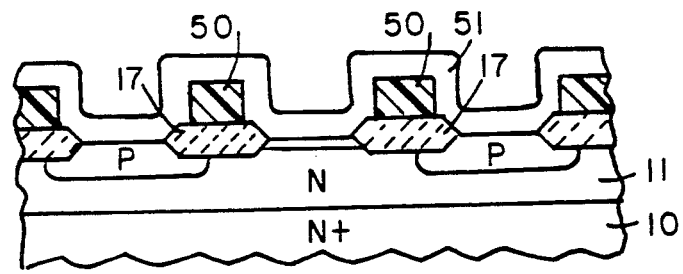
FIGS. 4A through 4D illustrate a third method in accordance with the present invention of forming ohmic In the figures the various elements are not drawn to scale. Certain dimensions are exaggerated in relation to other dimensions in order to present a clearer understanding of the invention.
Figure 4B:
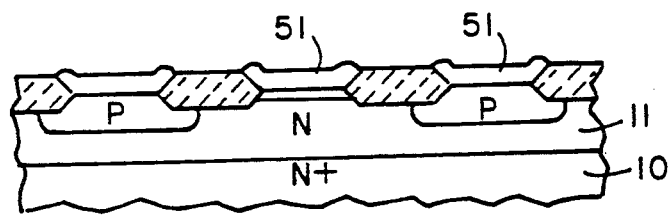

Another method of forming ohmic contacts to the source and gate regions of the device structure of FIG. 1F in accordance with the present invention is illustrated by FIGS. 4A through 4D. A layer of photoresist material 50 is placed on the surface of the wafer, and by employing conventional techniques the photoresist material is removed except in the areas of the silicon oxide regions 17. (FIG. 4A.) That is, the source surface areas and gate surface areas are exposed. A thin layer of germanium 51 is then deposited on the surface by employing conventional evaporation techniques The photoresist material 50 is then removed by etching in a suitable etching solution. As is well understood the overlying germanium is removed with the photo-resist material. The resulting structure is illustrated in FIG. 4B.

Figure 4C:
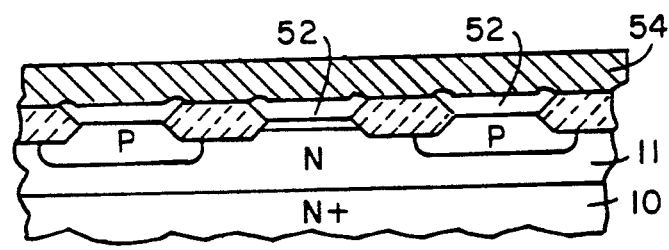
Figure 4D:
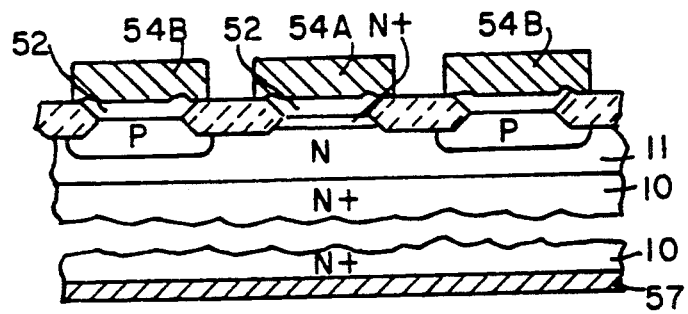

The wafer is then treated by the ion implantation of argon to intermix the germanium 51 with the underlying silicon to form a germanium-silicon composite 52. (FIG. 4C.) The wafer is subjected to rapid thermal annealing as previously described to recrystallize the germanium-silicon composite. Subsequently the wafer is processed in accordance with the previous discussions to deposit a metal layer of 54 of TiW, aluminum, and TiW. Suitable masking and etching procedures are then followed to remove the metal layer 54 except in the desired areas over the source and gate surface areas as illustrated in FIG. 4D to form ohmic contact members 54A and 54B to the germanium-silicon composite 52 of the source and gate regions, respectively. The bottom surface of the substrate is also metallized with a layer 57 to provide a suitable drain contact member.

In the final devices as illustrated in FIG. 2D, 3C, and 4D the source and gate contacts to the underlying source and gate regions are through a germanium-silicon composite or through germanium in a single crystal structure with the underlying silicon. The bandgap between the metallization and the underlying silicon is reduced by the presence of the germanium. Thus contact resistance is decreased enhancing the performance of the device.

While there has been shown and described what are considered preferred embodiments of the present invention, it will be obvious to those skilled in the art that various changes and modifications may be made therein without departing from the invention as defined by the appended claims.

What is claimed is:

1. A junction field effect transistor comprising
   a body of silicon including a substrate of single crystal silicon of one conductivity type of relatively low resistivity and a layer of single crystal silicon of the one conductivity type of relatively high resistivity contiguous with said substrate, said layer of silicon having a surface at a surface of the body:
   a layer of adherent, nonconductive, protective material adherent at said surface having openings therein defining alternating source surface areas and gate surface areas;
   a source region of the one conductivity type of relatively low resistivity inset in said layer of silicon of the one conductivity type of relatively high resistivity at each of said source surface areas;

a gate region of the opposite conductivity type inset in said layer of silicon of the one conductivity type of relatively high resistivity at each of said gate surface areas;

a recrystallized zone of germanium-silicon composite in each of said source regions and each of said gate regions at said source surface areas and said gate surface areas, respectively;

a source contact member in ohmic contact with the germanium-silicon composite in each of said source regions at each of said source surface areas;

a gate contact member in ohmic contact with the germanium-silicon composite in each of said gate regions at said gate surface areas; and a drain contact member in ohmic contact with the silicon of the substrate.

* * * * *